United States Patent
Chang

(10) Patent No.: US 7,278,046 B2
(45) Date of Patent: Oct. 2, 2007

(54) CIRCUIT AND METHOD FOR OUTPUTTING ALIGNED STROBE SIGNAL AND PARALLEL DATA SIGNAL

(75) Inventor: Chi Chang, Taipei (TW)

(73) Assignee: Via Technologies, Inc., Taipei (TW)

( * ) Notice: Subject to any disclaimer, the term of this patent is extended or adjusted under 35 U.S.C. 154(b) by 774 days.

(21) Appl. No.: 10/455,717

(22) Filed: Jun. 5, 2003

(65) Prior Publication Data

US 2004/0000940 A1    Jan. 1, 2004

(30) Foreign Application Priority Data

Jun. 26, 2002    (TW) .................................. 91113973

(51) Int. Cl.
G06F 1/00    (2006.01)
(52) U.S. Cl. ...................... 713/500; 327/276
(58) Field of Classification Search ................ 327/276; 713/500
See application file for complete search history.

(56) References Cited

U.S. PATENT DOCUMENTS

| | | | | |
|---|---|---|---|---|
| 5,948,083 A | * | 9/1999 | Gervasi | ........................ 710/62 |
| 6,195,759 B1 | * | 2/2001 | Salmon | ........................ 713/600 |
| 6,279,073 B1 | * | 8/2001 | McCracken et al. | ........ 711/105 |
| 6,292,521 B1 | * | 9/2001 | Lai et al. | ...................... 375/357 |
| 6,401,213 B1 | * | 6/2002 | Jeddeloh | ...................... 713/401 |
| 6,467,043 B1 | * | 10/2002 | LaBerge | ...................... 713/401 |
| 6,570,428 B1 | * | 5/2003 | Liao et al. | ................... 327/291 |
| 6,745,275 B2 | * | 6/2004 | Chang | ........................ 710/305 |
| 6,998,892 B1 | * | 2/2006 | Nguyen et al. | ............. 327/161 |

* cited by examiner

Primary Examiner—Chun Cao
Assistant Examiner—Vincent T Tran

(57) ABSTRACT

An output circuit includes a level-change detecting device, a delay adjusting device and a first multiplexer. The level-change detecting device receives the parallel data signal, detects a level change degree of the parallel data signal between a first time point and a second time point, and outputs a select signal according to the level change degree. The delay adjusting device receives a strobe signal and differentially delaying the strobe signal into a first and a second delayed strobe signals with a first and a second delay time, respectively. The first multiplexer is electrically connected to the level-change detecting device and the delay adjusting device, and selects one of the first and the second delayed strobe signals to be outputted in response to the select signal.

17 Claims, 10 Drawing Sheets

CIRCUIT AND METHOD FOR OUTPUTTING ALIGNED STROBE SIGNAL AND PARALLEL DATA SIGNAL

FIELD OF THE INVENTION

The present invention relates to a circuit for outputting a strobe signal and a parallel data signal, and more particularly to a circuit for outputting aligned strobe and parallel data signals. The present invention also relates to a method for aligning and outputting a parallel data signal and a strobe signal.

BACKGROUND OF THE INVENTION

For complying with the increasing processing frequency of a core of a computer system chip, data transmitted via I/O buses are preferably parallel data. However, problems are likely to occur during the transmission of parallel data signals. For example, power/ground bounce noise is likely generated at the input and output ends. Generally, when the output end of an output buffer is in switching status, a power/ground bounce noise is derived from the flow of intense current through the parasitic inductance of the bonding wires, lead frame or pin. In addition, it may suffer from a so-called SSO (simultaneous switching output) skew phenomenon.

Please refer to FIG. 1, which schematically illustrates conventional output buffers commonly electrically connected to a power voltage and a ground voltage. Each of the output buffers B1~Bn is coupled to both of a common power source Vpp and a common ground Vss. Since the common power source Vpp is electrically connected to a pad via pins and bounding wires, parasitic inductances associated with the pins and pad/bounding wires will be generated between the output buffers B1~Bn and the common power source Vpp, which is indicated by an equivalent inductance L1. Likewise, pin parasitic inductance and pad/bounding-wire inductance are generated between the output buffers B1~Bn and the common ground Vss, which is indicated by an equivalent inductance L2.

Due to the existence of the parasitic inductances L1 and L2 between the output buffers B1~Bn and the common power source and ground Vpp and Vss, respectively, when some of the output buffers B1~Bn change their output states at the same time, instaneous current change will result in the undesirable power/ground bounce effect.

Please refer to FIG. 2. When a number of output buffers simultaneously change their output states from a low level to a high level, the SSO skew phenomenon is likely to occur so as to delay the parallel data signal MD to some extent, as indicated by a period T1 of FIG. 2. Likewise, for the change of the output states of the output buffers from a high level to a low level, the parallel data signal MD is delayed as indicated by a period T2 of FIG. 2 due to the SSO skew phenomenon. The degree of the SSO skew is dependent on numbers of output buffers on changing. That is to say, when more output buffers change from the low level to the high level or the high level to the low level at the same time, the SSO skew becomes more serious, and the delayed period T1 or T2 is increased.

Along with the parallel data signal, a strobe signal DQS is outputted to decide when a downstream device should pick up the parallel data. Generally, the rising and falling edges of the strobe signal DQS are located within effective access ranges of the parallel data signal MD and preferably in the middle of the effective access ranges. Due to the SSO skew, the time margin allowing the downstream device to pick up the parallel data in response to the original strobe signal is even limited if a large quantity of parallel data required to be processed by the I/O bus. For example, parallel data of up to 64 bits are simultaneously processed by a Dynamic Random Access Memory (DRAM) or a central processing unit (CPU). The reduced time margin leads to the difficulty in receiving data or obtaining accurate data.

SUMMARY OF THE INVENTION

It is an object of the present invention to provide an output circuit for outputting a strobe signal and a parallel data signal so as to compensate influence of SSO skew and thus assure of accurate data transmission.

A first aspect of the present invention relates to an output circuit for outputting a strobe signal aligned with a parallel data signal. The output circuit comprises a level-change detecting device receiving the parallel data signal, detecting a level change degree of the parallel data signal between a first time point and a second time point, and outputting a select signal according to the level change degree; a delay adjusting device receiving a strobe signal and differentially delaying the strobe signal into a first and a second delayed strobe signals with a first and a second delay time, respectively; and a first multiplexer electrically connected to the level-change detecting device and the delay adjusting device, and selecting one of the first and the second delayed strobe signals to be outputted in response to the select signal.

Preferably, the delay adjusting device comprises a first delay circuit electrically connected to the first multiplexer for delaying the strobe signal into the first delayed strobe signal and outputting the first delayed strobe signal with the first delay time; and a second delay circuit electrically connected to the first multiplexer for delaying the strobe signal into the second delayed strobe signal and outputting the second delayed strobe signal with the second delay time.

In an embodiment, each of the first delay circuit and the second delay circuit is controlled by a load control signal associated with a driven load required for data transmission. Preferably, the driven load is detected by the basic input/output system (BIOS) when the computer is initialized.

Preferably, the level-change detecting device comprises a first flip-flop device receiving the parallel data signal and a first clock signal, latching the parallel data signal in response to a rising or a falling edge of the first clock signal at the first time point, and outputting a first latched parallel data obtained by latching the parallel data signal at the first time point; a second flip-flop device receiving the first latched parallel data outputted from the first flip-flop device and the first clock signal, latching the first latched parallel data in response to the rising or falling edge of the first clock signal at the second time point, and outputting a second latched parallel data obtained by latching the first latched parallel data at the second time point; and a detector electrically connected to the first and the second flip-flop devices, receiving the first and the second latched parallel data to determine the level change degree of the parallel data signal between the first and the second time points, and outputting the select signal according to the level change degree.

More preferably, the level-change detecting device further comprises a third flip-flop device receiving the parallel data signal and a second clock signal, latching the parallel data signal in response to a rising or a falling edge of the second clock signal at a third time point, and outputting a third latched parallel data obtained by latching the parallel data signal at the third time point; and a fourth flip-flop device receiving the third latched parallel data outputted from the third flip-flop device and the second clock signal, latching the third latched parallel data in response to the rising or falling edge of the second clock signal at a fourth time point, and outputting a fourth latched parallel data obtained by latching the third latched parallel data at the fourth time point. The detector is further electrically connected to the third and the fourth flip-flop devices, receiving the third and the fourth latched parallel data to determine another level change degree of the parallel data signal between the third and the fourth time points, and outputting another select signal according to the another level change degree.

Preferably, the second clock signal has a phase reverse to the first clock signal, the first and second clock signals use the same one of the rising and falling edges to trigger the latch operations of the first, second, third and fourth flip-flop devices, and the detector alternately outputs the select signal and the another select signal.

Another aspect of the output circuit according to the present invention comprises a detector receiving a parallel data signal, detecting a level change degree for the parallel data signal between a first time point and a second time point, and outputting a select signal according to the level change degree; a delay adjusting device receiving and differentially delaying the parallel data signal into a first and a second delayed parallel data signals with a first and a second delay time, respectively; and a first multiplexer electrically connected to the detector and the delay adjusting device, and selecting one of the first and the second delayed parallel data signals to be outputted in response to the select signal.

Preferably, the delay adjusting device comprises a first delay circuit electrically connected to the first multiplexer for delaying the parallel data signal into the first delayed parallel data signal and outputting the first delayed parallel data signal with the first delay time; and a second delay circuit electrically connected to the first multiplexer for delaying the parallel data signal into the second delayed parallel data signal and outputting the first delayed parallel data signal with the second delay time.

Preferably, the output circuit further comprises a third delay circuit for delaying the strobe signal into a delayed strobe signal with a third delay time; and a second multiplexer electrically connected to the third delay circuit, and performing a dummy delay operation on the delayed strobe signal so as to compensate time delay of the first multiplexer. More preferably, the third delay time is greater than each of the first delay time and the second delay time.

Preferably, the output circuit further comprises a first flip-flop device electrically connected to the detector, receiving the parallel data signal and a first clock signal, latching the parallel data signal in response to a rising or a falling edge of the first clock signal at the first time point, and outputting a first latched parallel data obtained by latching the parallel data signal at the first time point; and a second flip-flop device electrically connected to the detector and the first flip-flop device, receiving the first latched parallel data outputted from the first flip-flop device, latching the first latched parallel data outputted from the first flip-flop device in response to the rising or falling edge of the first clock signal at the second time point, and outputting a second latched parallel data obtained by latching the first latched parallel data at the second time point to the detector. More preferably, the output circuit further comprises a third flip-flop device electrically connected to the detector, receiving the parallel data signal and a second clock signal, latching the parallel data signal in response to a rising or a falling edge of the second clock signal at a third time point, and outputting a third latched parallel data obtained by latching the parallel data signal at the third time point; and a fourth flip-flop device electrically connected to the detector and the third flip-flop device, receiving the third latched parallel data outputted from the third flip-flop device, latching the third latched parallel data in response to the rising or falling edge of the second clock signal at a fourth time point, and outputting a fourth latched parallel data obtained by latching the third latched parallel data at the fourth time point. The third and the fourth latched parallel data are transmitted to the detector to determine another level change degree of the parallel data signal between the third and the fourth time points, and the detector outputs another select signal associated with the fourth time point according to the another level change degree.

Preferably, a third multiplexer is electrically connected to the delay adjusting device, and selecting one of the first latched parallel data transmitted from the first flip-flop device and the third latched parallel data transmitted from the third flip-flop device to be outputted into the delay adjusting device in response to a third clock signal.

Desirably, the second clock signal has a phase reverse to the first clock signal, the first and second clock signals use the same one of the rising and falling edges to trigger the latch operations of the first, second, third and fourth flip-flop devices, and the detector alternately outputs the select signal and the another select signal.

Preferably, the third clock signal has a phase difference of 45 degrees with respect to the first clock signal.

A third aspect of the present invention relates to a method for outputting aligned parallel data signal and strobe signal. The method comprises steps of receiving a parallel data signal and a strobe signal; detecting a level change degree for the parallel data signal between a first time point and a second time point, and outputting a select signal according to the level change degree; processing one of the parallel data signal and the strobe signal into a plurality of different signals; and selecting one of the plurality of different signals to be outputted along with the other one of the parallel data signal and the strobe signal according to the select signal.

Preferably, the plurality of different signals are obtained by differently delaying the parallel data signal, and the strobe signal is simultaneously delayed more than any of the plurality of different signals.

Alternatively, the plurality of different signals are obtained by differentially delaying the strobe signal. For example, the strobe signal is differentially delayed according to a driven load required for data transmission.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
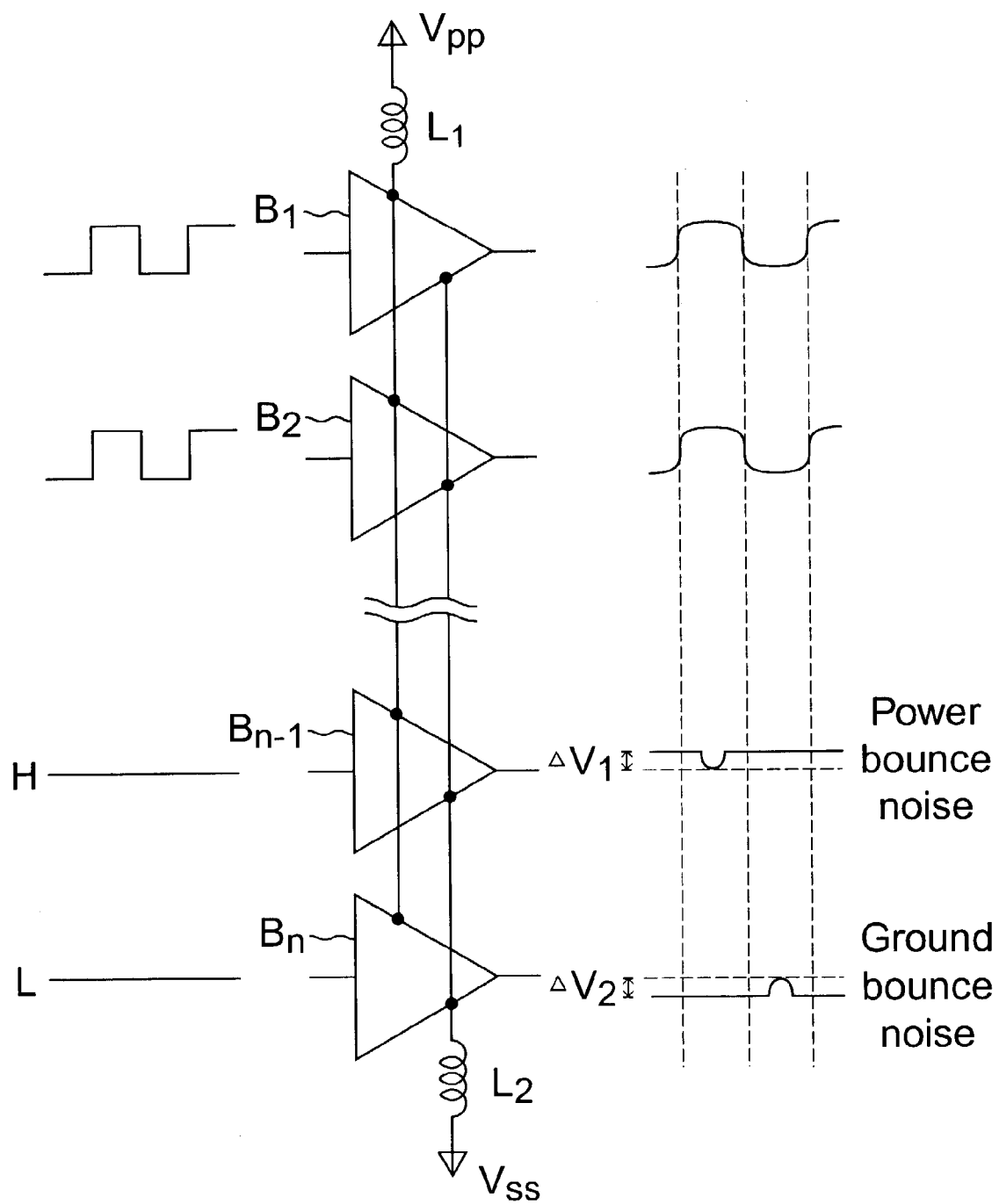
FIG. 1 schematically illustrates power/ground bounce occurring in output buffers commonly electrically connected to a power voltage and a ground voltage.
Figure 2:
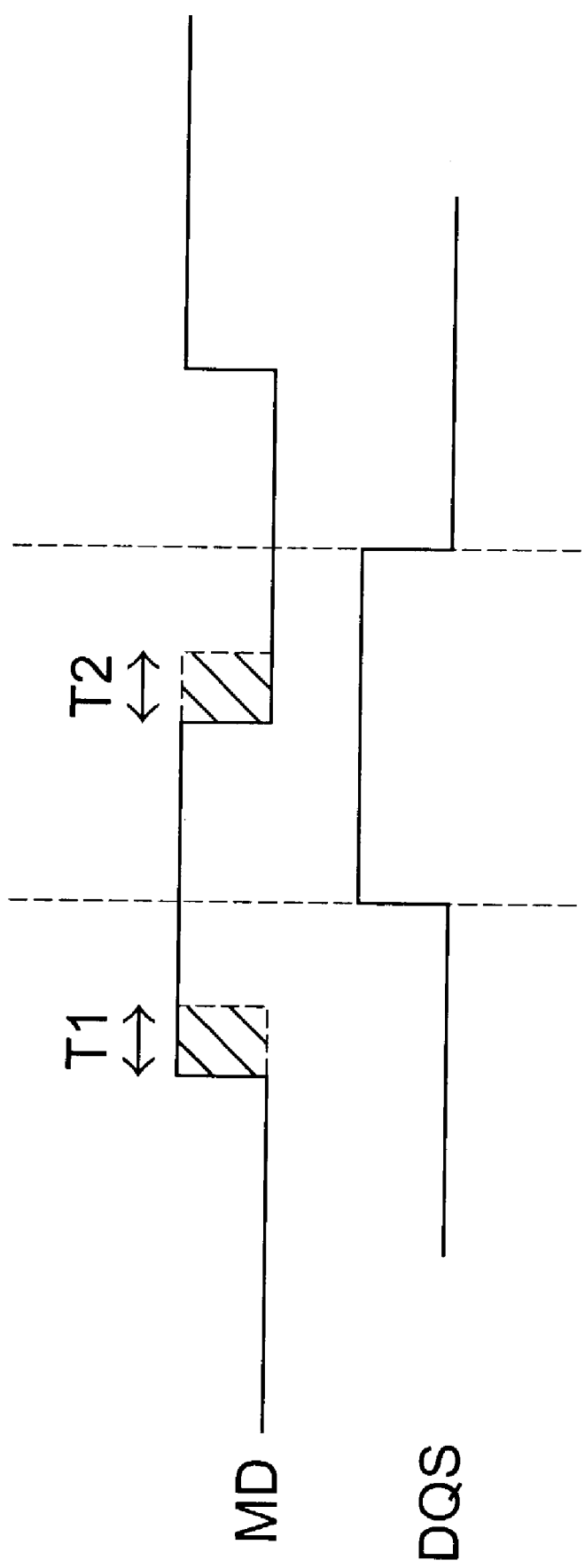
FIG. 2 is a timing waveform diagram showing misalignment of the output parallel data signal and the strobe signal due to SSO skew.
Figure 3A:
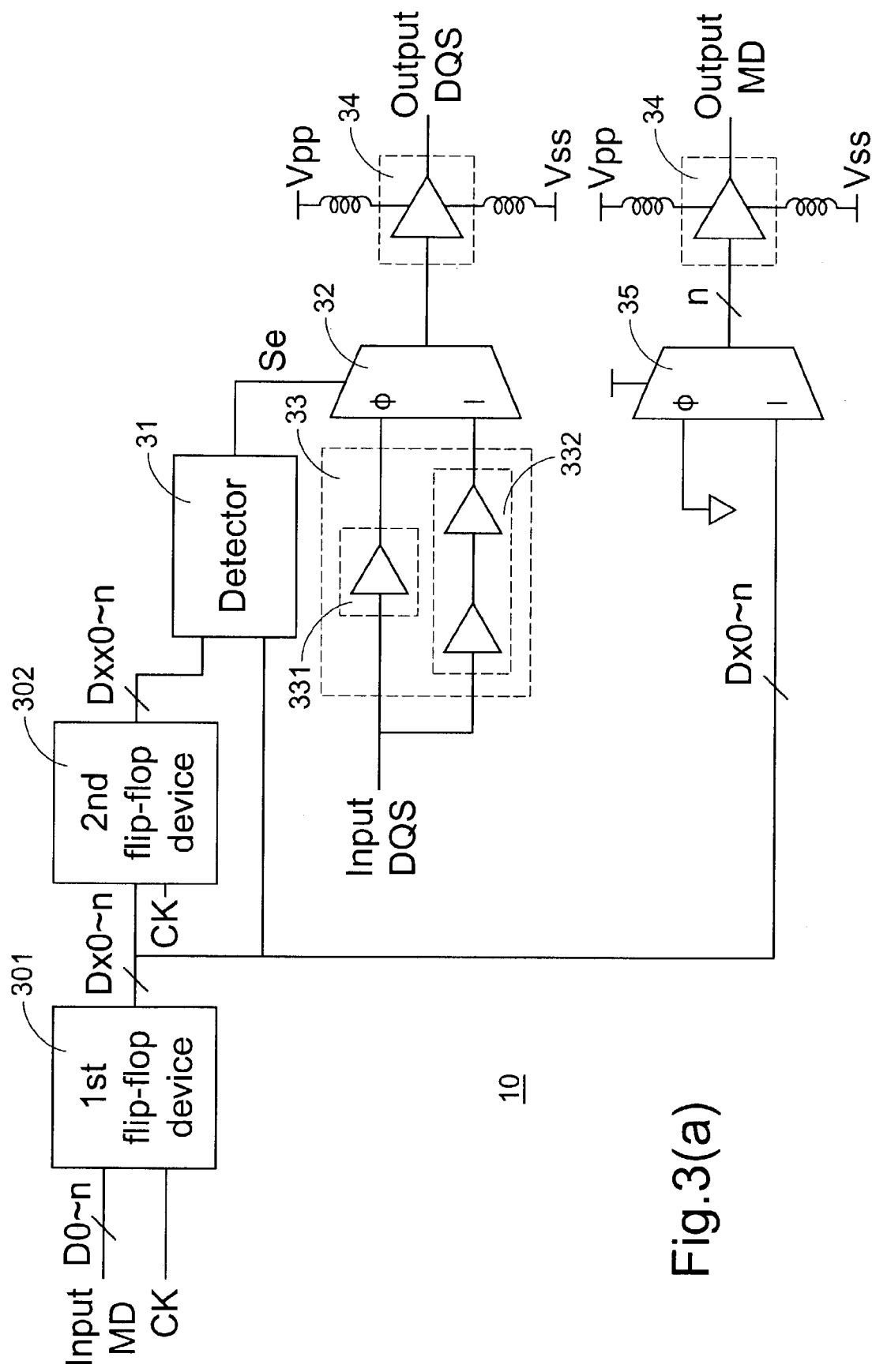
FIGS. 3(a), 3(b), 3(c) and 3(d) are schematic circuit block diagram illustrating four embodiments of output circuits for outputting aligned strobe and parallel data signals according to the present invention, respectively.

Please refer to FIG. 3(a), which illustrates an output circuit for outputting aligned strobe and parallel data signals according to a preferred embodiment of the present invention. The alignment of the strobe signal with the parallel data signal means the rising and/or falling edge of the output strobe signal is located within the valid data pickup range of the parallel data signal. More specifically, the phase difference between the output strobe signal and the output parallel data signal is kept at ¼ cycle, i.e. 90 degrees, by the present output circuit, and the setup/hold time margin of the output strobe signal for receiving data is identical to that of the input strobe signal.

The output circuit in this embodiment is implemented by adjusting the phase of the strobe signal and comprises a first flip-flop device 301, a second flip-flop device 302, a detector 31, a first multiplexer 32, a delay adjusting device 33, I/O pads 34 and a second multiplexer 35. The first flip-flop device 301 receives an input parallel data signal MD and a clock signal CK. In response to either rising or falling edges of the clock signal CK, the first flip-flop device 301 latches the input parallel data signal MD to output first latched parallel data. Then the second flip-flop device 302 receives and latches the first latched parallel data in response to the rising or falling edges of the clock signal CK, outputs second latched parallel data. Therefore, at a certain time point when a rising or falling edge of the clock signal CK is entered, parallel data D0~n are received by the output circuit 10 and inputted to the first flip-flop device 301, first latched parallel data Dx0~n are outputted from the first flip-flop device 301 to the second flip-flop device 302, and second latched parallel data Dxx0~n are outputted by the second flip-flop device 302. The first latched parallel data Dx0~n are also outputted to the multiplexer 35.

The latched parallel data Dx0~n and Dxx0~n are transmitted to the detector 31, and the detector 31 outputs a select signal Se according to the difference between the first latched parallel data Dx0~n and the second latched parallel data Dxx0~n. More specifically, a level change degree of the two parallel data Dx0~n and Dxx0~n, which are realized by latching the parallel data signal MD at two different time points, is determined by the detector 31. When the level change degree is over 50%, i.e. over 50% levels of parallel data are changed, a heavy switching group is determined and thus a high-level select signal Se is asserted. On the contrary, a light switching group is determined so that the detector 31 asserts a low-level select signal Se when the level change degree is under 50%. Take an 8-bit input parallel data signal for example. The detector 31 outputs a high-level select signal when levels of 5~8 bits of data are changed, while the detector 31 outputs a low-level select signal when levels of 0~4 bits of data are changed. Since the degree of the undesired SSO skew of the output parallel data signal MD is dependent on numbers of output buffers on level-changing, the SSO will be more serious in the heavy switching group than in the light switching group. Therefore, phase drift Tssoh occurring in the heavy switching group is more significant than phase drift Tssol occurring in the light switching group, as shown in FIG. 4.

Figure 4:
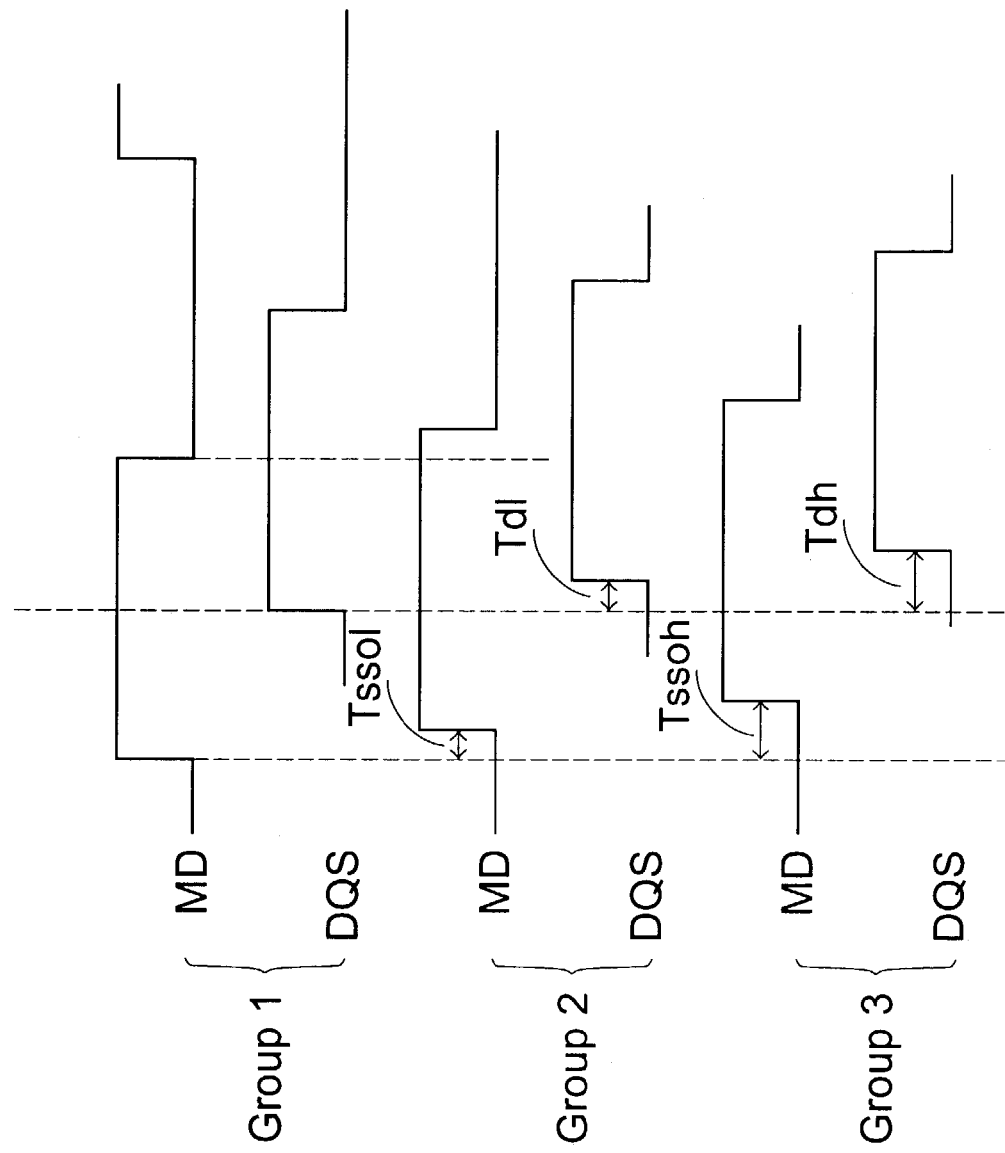
FIG. 4 is a timing waveform diagram illustrating the alignment of parallel data signals with corresponding strobe signals by adjusting the phase of the strobe signals.

In FIG. 4, the pair of output parallel data signal MD and the output strobe signal DQS in Group 1 represent ideal situation without SSO screw. The pair of the output parallel data signal MD and the output strobe signal DQS in Group 2 represent light switching group situation with less significant SSO screw, while the pair of output parallel data signal MD and the output strobe signal DQS in Group 3 represent heavy switching group situation with more significant SSO screw. Accordingly, the strobe signal is outputted with delay time varying with the degree of the SSO skew for making compensation according to the present invention. For example, when the heavy switching group is determined, the strobe signal DQS is delayed by a relatively delay time Tdh to compensate the phase drift Tssoh. On the other hand, a relatively short delay time Tdl of the strobe signal is required to compensate the phase drift Tssol. As shown in FIG. 4, by the adjusting method of the present invention, the output condition of the strobe signal DQS can vary with the situation of the parallel data signal MD so as to be properly aligned with the output parallel data signal MD. In this embodiment, the delay adjusting device 33 is provided to achieve this purpose.

Referring to FIG. 3(a) again, the delay adjusting device 33 is coupled to the first multiplexer 32 and receives an input strobe signal DQS. The delay adjusting device 33 comprises a first delay circuit 331 and a second delay circuit 332, both electrically connected to the first multiplexer 32. While the first delay circuit 331 operates to provide the relatively short delay time Tdl, the second delay circuit 332 operates to provide the relatively long delay time Tdh. By means of the first and the second delay circuits, the input strobe signal DQS is differentially delayed so as to make different degrees of compensation for the output strobe signal DQS in order to align the output strobe signal DQS with the output parallel data signal MD. As mentioned above, the select signal Se is at a low level in the light switching group situation and a high level in the heavy switching group situation. Therefore, the output of the first delay circuit 331 is selected by the first multiplexer 32 to be outputted in response to a low level of the select signal Se. On the other hand, when the select signal Se is at a high level, the output of the second delay circuit 332 is selected by the first multiplexer 32 to be outputted. Preferably, the second multiplexer 35 similar to the first multiplexer 32 is arranged in the data signal path to perform a dummy delay operation on the parallel data signal MD in order to compensate the time delay of the first multiplexer 32.

Figure 3B:
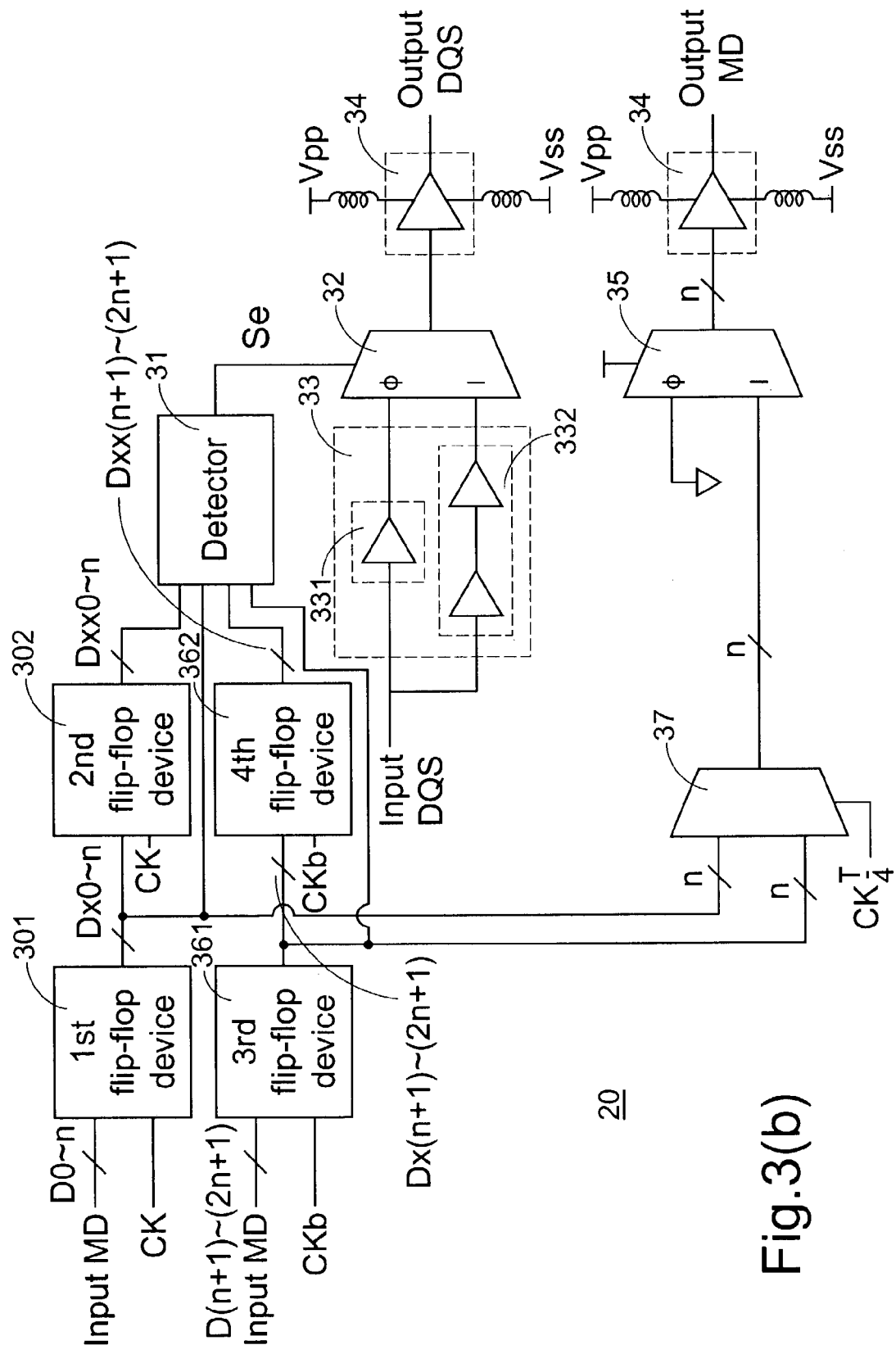

Please refer to FIG. 3(b), which schematically shows a second embodiment of the output circuit according to the present invention. The output circuit 20 of FIG. 3(b) is similar to the output circuit 10 of FIG. 3(a) except that a third flip-flop device 361, a fourth flip-flop device 362 and a third multiplexer 37 are further included in the output circuit 20 in order to perform Double Data Rate (DDR) transmission. The output circuit 20 in this embodiment also outputs aligned parallel data signal MD and strobe signal DQS by adjusting the phase of the strobe signal. The third flip-flop device 361 receives the input parallel data signal MD and a clock signal CKb. The clock signal CKb has a phase reverse to the clock signal CK. In response to either the rising or the falling edges of the clock signal CKb, the third flip-flop device 361 latches the input parallel data signal MD, and then outputs third latched parallel data Dx(n+1)~(2n+1). The fourth flip-flop device 362 receives and latches the third latched parallel data Dx(n+1)~(2n+1) in response to the rising or falling edge of the clock signal CKb, and then outputs fourth latched parallel data Dxx(n+1)~(2n+1). Therefore, at a certain time point when the rising or falling edge of the clock signal CK is entered, parallel data D0~n are inputted to the first flip-flop device 301, first latched parallel data Dx0~n are outputted by the first flip-flop device 301, and second latched parallel data Dxx0~n are outputted by the second flip-flop device 302. The first latched parallel data Dx0~n are also outputted to the multiplexer 37. Subsequently, at next time point when the rising or falling edge of the clock signal CKb is entered, parallel data D(n+1)~(2n+1) are inputted to the third flip-flop device 361, third latched parallel data Dx(n+1)~(2n+1) are outputted by the third flip-flop device 361, and fourth latched parallel data Dxx(n+1)~(2n+1) are outputted by the fourth flip-flop device 362. The third latched parallel data Dx(n+1)~(2n+1) are also outputted to the multiplexer 37. In this embodiment, the first latched parallel data Dx0~n outputted from the first flip-flop device 301 and the third latched parallel data Dx(n+1)(2n+1) outputted from the third flip-flop device 361 are alternately outputted by the multiplexer 37 in response to both of the rising and falling edges of a clock signal CKT/4, thereby achieving the purpose of DDR transmission. The clock signal CKT/4 is derived from the clock signal CK with ¼ cycle (90°) delay.

The detector 31 detects the latched parallel data, and outputs a select signal Se according to a level change degree of the parallel data realized by latching the parallel data signal MD at different time points. For example, the detector 31 detects the latched parallel data Dx0~n and Dxx0~n in response to the rising edge of the clock signal CK at the time point TP1, and detects the latched parallel data Dx(n+1)~(2n+1) and Dxx(n+1)~(2n+1) in response to the rising edge of the clock signal CKb at the time point TP2 next to TP1. In response to any of the detection operations, the detector 31 outputs the select signal Se indicative of a light switching group to have the multiplxer 32 select the output of the first delay circuit 331 or the select signal Se indicative of a heavy switching group to have the multiplxer 32 select the output of the first delay circuit 332. As has been understood from the first embodiment, while the strobe signal DQS outputted from the delay circuit 332 is delayed by a relatively long delay time Tdh, the strobe signal DQS outputted from the delay circuit 331 is delayed by a relatively short delay time Tdl. The adjusting method illustrated with reference to the waveform diagram of FIG. 4 can also be applied here.

Figure 3C:
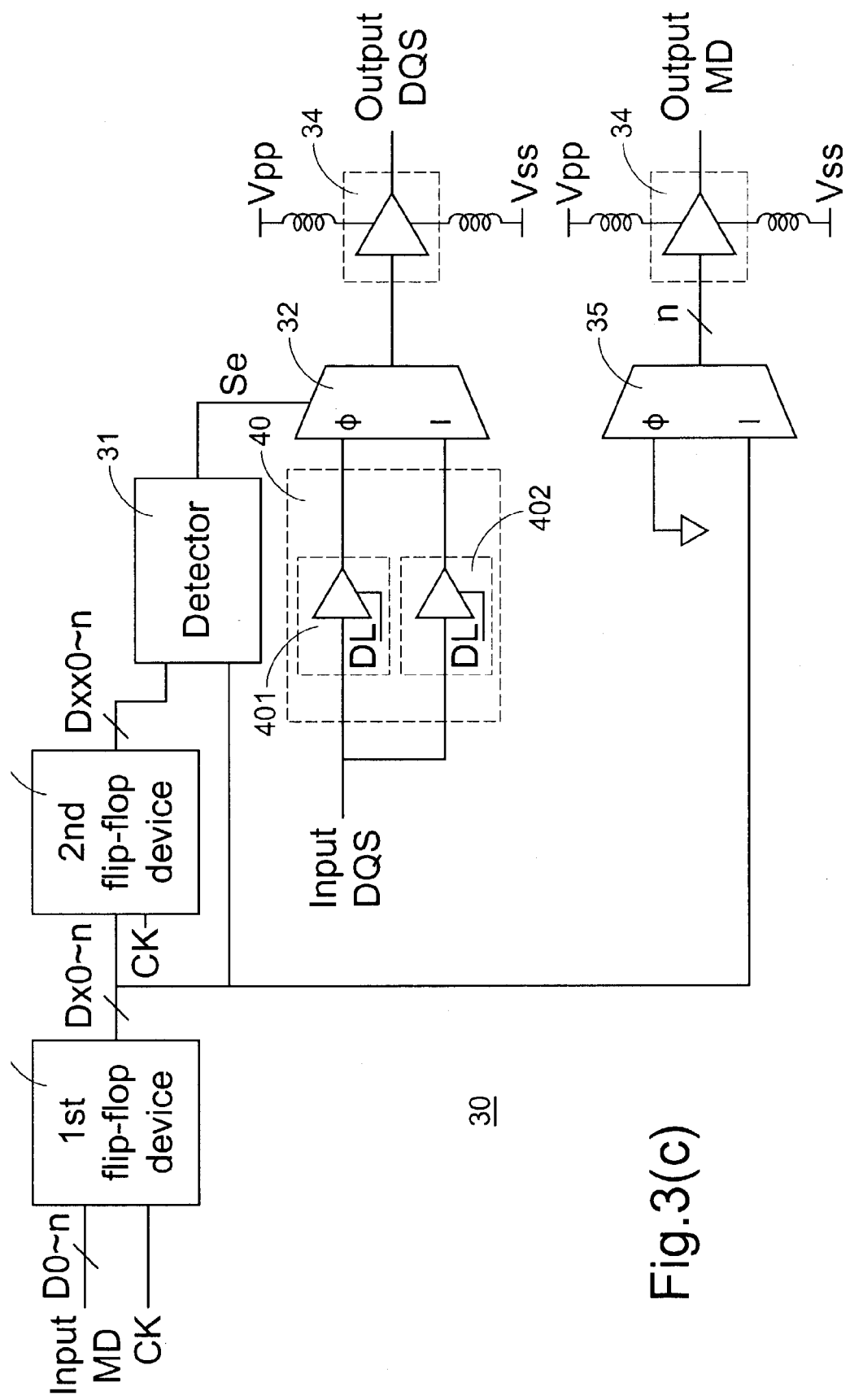

Please refer to FIG. 3(c), which schematically shows a third embodiment of the output circuit according to the present invention. The output circuit 30 of FIG. 3(c) is similar to that of FIG. 3(a) except for the replacement of a delay adjusting device 40 for the delay adjusting device 33. The delay adjusting device 40 comprises a first delay circuit 401 and a second delay circuit 402. Each of the first delay circuit 401 and the second delay circuit 402 is controlled by a load control signal DL associated with a driven load required for data transmission, respectively. For example, the output circuit 30 of FIG. 3(c) is used in a computer system, and the driven load relates to a memory device. When a great amount of memories are inserted into the slots of the computer, a considerable driven load is imposed on the computer system. On the contrary, for a small amount of memories, the driven load is relatively low. In this embodiment, both of the first delay circuit 401 and second delay circuit 402 delay the strobe signal DQS by a relatively long delay time for a high driven load situation, and delay the strobe signal DQS by a relatively short delay time for a low driven load situation. In practice, when the computer system is initiated, a basic input/output system (BIOS) will detect the associated driven load and transmit information of the driven load to a control chip (not shown). The control chip then transmits the load control signal DL to the delay adjusting device 40 so as to properly adjust delay time of the strobe signal DQS. For example, when the BIOS detects only one memory is inserted into the slot, a delay time Tdl (for example 0.1 ns) of the strobe signal DQS is rendered to compensate for the light switching group situation, and a delay time Tdh (for example 0.3 ns) is rendered to compensate for the heavy switching group situation. In another example where four memories are inserted into the slots, a delay time Tdl' (for example 0.3 ns) of the strobe signal DQS is rendered to compensate for the light switching group situation, and a delay time Tdh' (for example 0.5 ns) is rendered to compensate for the heavy switching group situation. In other words, the delay time of the strobe signal DQS outputted by the multiplexer 32 from either of the first delay circuit 401 and the second delay circuit 402 can be automatically adjusted according to the load control signal DL indicative of certain driven load of the computer system.

Figure 3D:
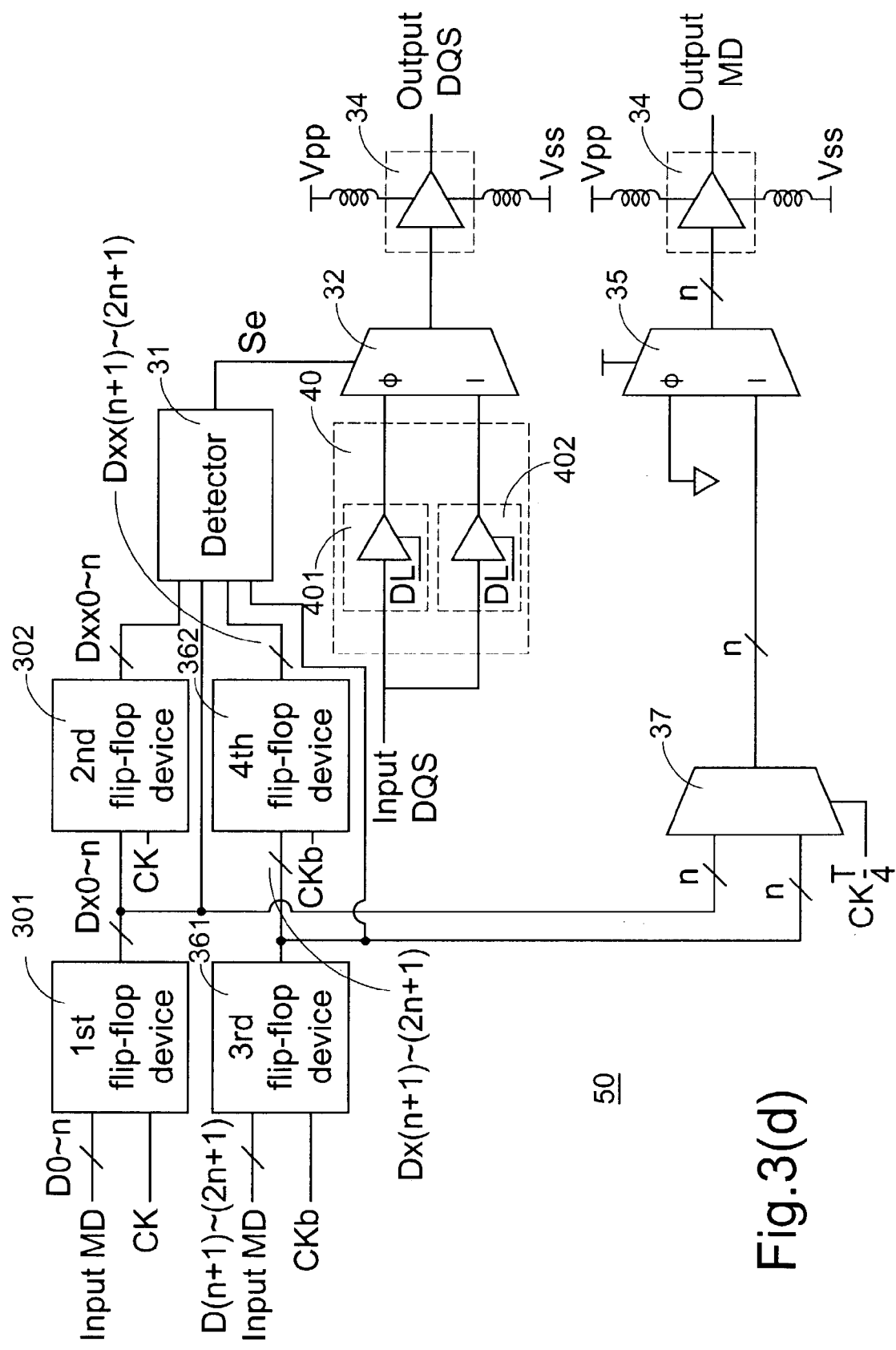

Please refer to FIG. 3(d), which schematically shows a fourth embodiment of the output circuit according to the present invention. The output circuit 50 of FIG. 3(d) is similar to that of FIG. 3(c) except that a third flip-flop device 361, a fourth flip-flop device 362 and a third multiplexer 37 are further included in the output circuit 50, thereby providing a Double Data Rate (DDR) transmission. Please refer to FIG. 3(b) and the relevant description to understand the functions and operations of the third flip-flop device 361, fourth flip-flop device 362 and third multiplexer 37.

Figure 5A:
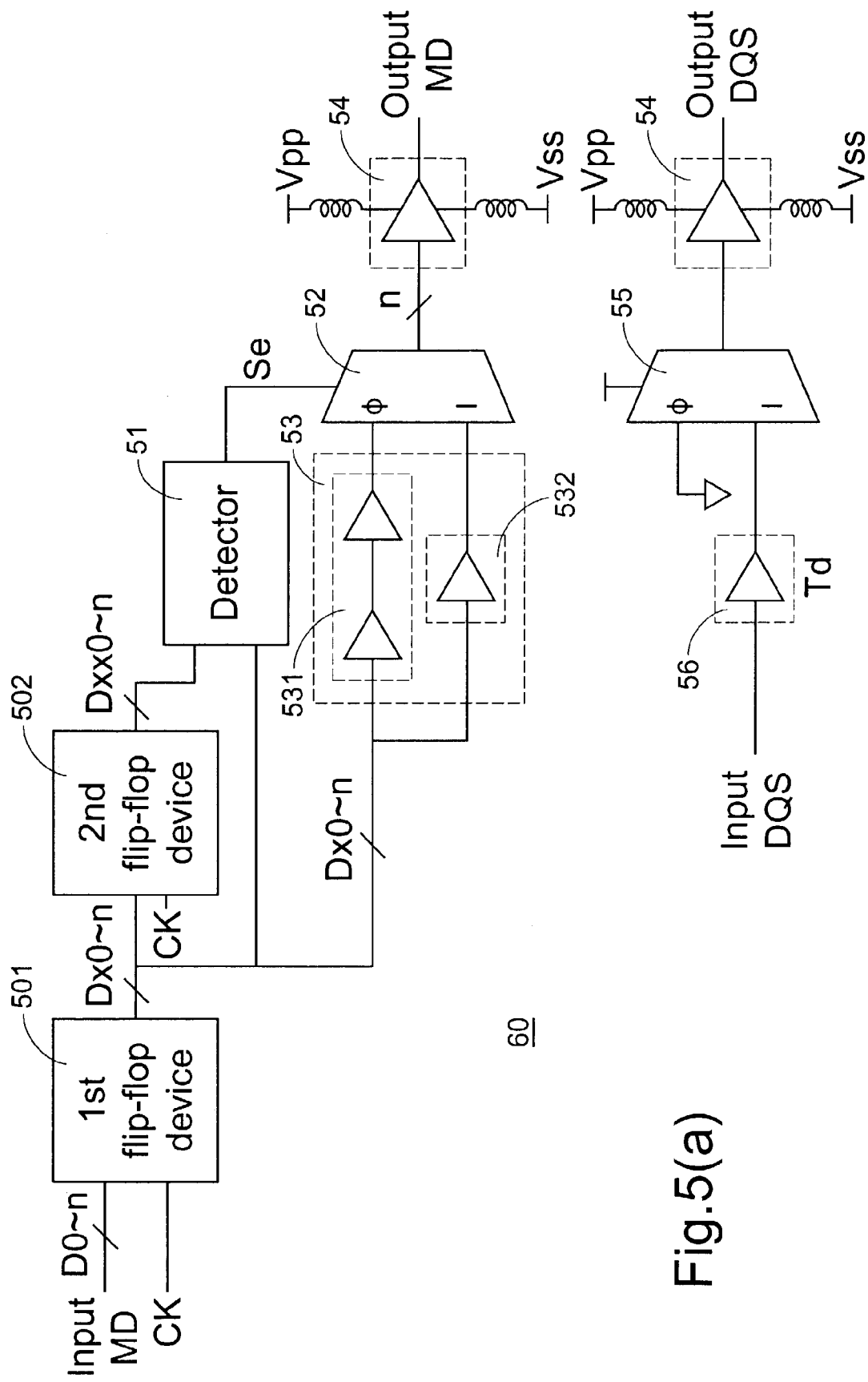
FIGS. 5(a) and 5(b) are circuit block diagram illustrating two embodiments of output circuits for outputting aligned strobe and parallel data signals according to the present invention, respectively.

Please refer to FIG. 5(a), which illustrates an output circuit 60 for outputting aligned strobe and parallel data signals according to fifth embodiment of the present invention. The output circuit 60 is implemented by adjusting the phase of the parallel data signals and comprises a first flip-flop device 501, a second flip-flop device 502, a detector 51, a first multiplexer 52, a delay adjusting device 53, I/O pads 54 and a second multiplexer 55.

The first flip-flop device 501 receives an input parallel data signal MD and a clock signal CK. In response to either of the rising and falling edge of the clock signal CK, the first flip-flop device 501 latches the parallel data D0~n, and subsequently outputs first latched parallel data Dx0~n. The second flip-flop device 502 receives the first latched parallel data Dx0~n and the clock signal CK. In response to the rising or falling edge of the clock signal CK, the second flip-flop device 502 latches the first latched parallel data Dx0~n and outputs second latched parallel data Dxx0~n. Therefore, at a certain time point when the rising or falling edge of the clock signal CK is entered, parallel data D0~n are inputted to the first flip-flop device 501, first latched parallel data Dx0~n are outputted by the first flip-flop device 501, and second latched parallel data Dxx0~n are outputted by the second flip-flop device 502. The parallel data Dx0~n are also outputted via the delay adjusting device 53, the multiplexer 52 and the I/O pad 54.

Figure 6:
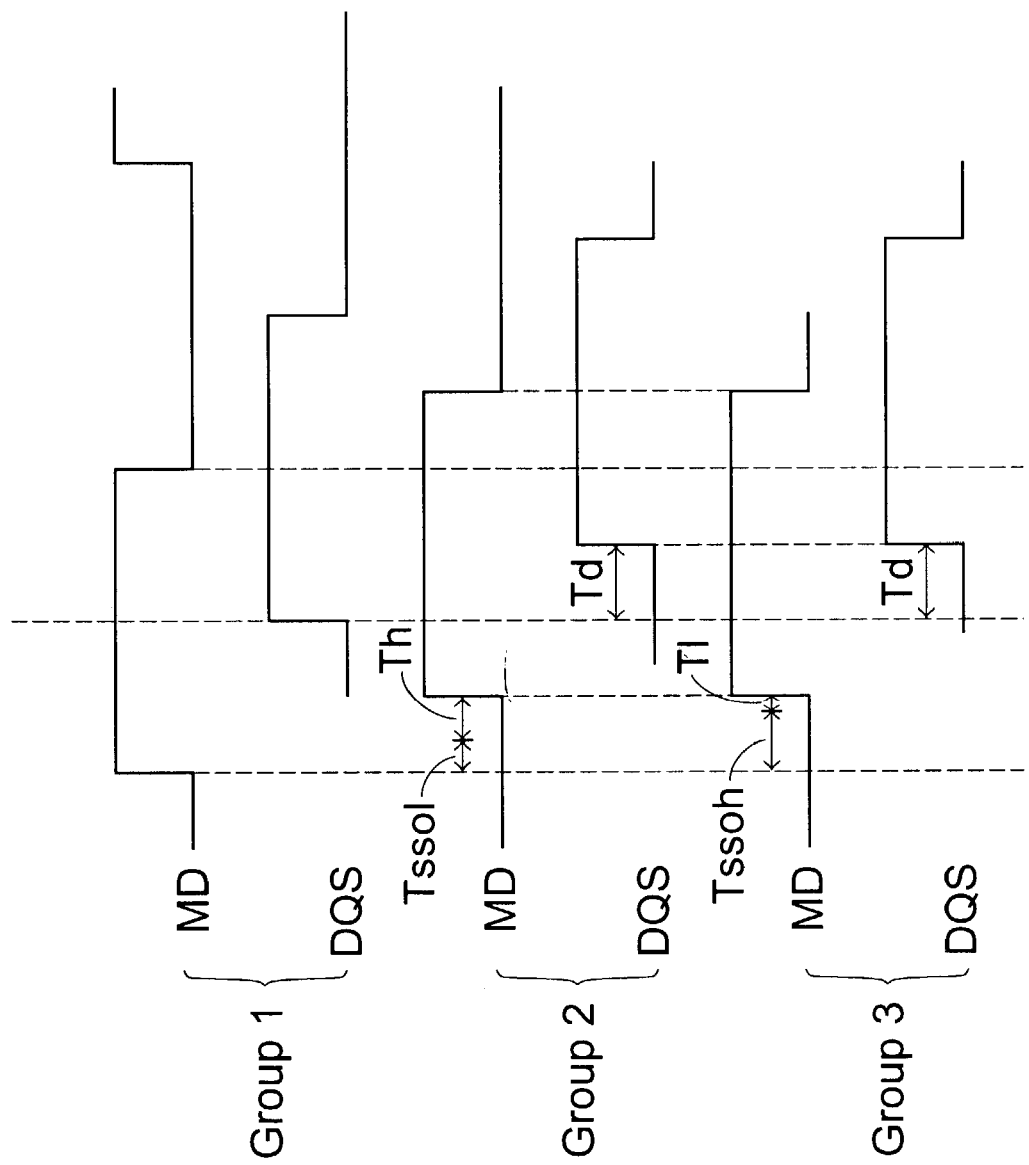
FIG. 6 is a timing waveform diagram illustrating the alignment of parallel data signals with strobe signals by adjusting the phase of the parallel data signals.

The detector 51 is employed to detect the latched parallel data Dx0~n and Dxx0~n, which represent the parallel data obtained by latching the parallel data signal MD at different time points, and outputs a select signal Se according to a level change degree of the two sets of parallel data. When the level change degree is over 50%, i.e. over 50% levels of parallel data are changed, a heavy switching group is determined and thus a high-level select signal Se is asserted. On the contrary, a light switching group is determined so that the detector 51 asserts a low-level select signal Se when the level change degree is under 50%. In FIG. 6, the pair of output parallel data signal MD and the output strobe signal DQS in Group 1 represent ideal situation without SSO screw. The pair of the output parallel data signal MD and the output strobe signal DQS in Group 2 represent light switching group situation with less significant SSO screw, while the pair of output parallel data signal MD and the output strobe signal DQS in Group 3 represent heavy switching group situation with more significant SSO screw. Accordingly, the strobe signal is outputted with a constant and longest delay time Td, and the parallel data signal is outputted with a delay time varying with the degree of the SSO skew for compensation according to the present invention. For example, when the heavy switching group is determined, the strobe signal DQS is delayed by a time Td, and the parallel data signal is delayed by a relatively short delay time Tl to compensate the phase drift Tssoh, where Td=Tssoh+Tl. On the other hand, when the light switching group is determined, the strobe signal DQS is delayed by a time Td, and the parallel data signal is delayed by a relatively long delay time Th to compensate the phase drift Tssol, where Td=Tssol+Th. In this embodiment, the delay adjusting device 53 is provided to achieve this purpose.

Referring to FIG. 5(a) again, the delay adjusting device 53 is coupled to the first flip-flop device 501 and receives the first latched parallel data Dx0~n. The delay adjusting device 53 comprises a first delay circuit 531 and a second delay circuit 532, both electrically connected to the first multiplexer 52. While the first delay circuit 531 operates to provide the relatively long delay time Th, the second delay circuit 532 operates to provide the relatively short delay time Tl. By means of the first and the second delay circuits 531 and 532, the first latched parallel data Dx0~n is differentially delayed so as to make different degrees of compensation in order to align with the output strobe signal DQS having been delayed by the longest delay time Td by the delay circuit 56. As mentioned above, the select signal Se is at a low level in the light switching group situation and a high level in the heavy switching group situation. Therefore, the output of the first delay circuit 531 is selected by the first multiplexer 52 to be outputted in response to a low level of the select signal Se. On the other hand, when the select signal Se is at a high level, the output of the second delay circuit 532 is selected by the first multiplexer 52 to be outputted. Preferably, the second multiplexer 55 similar to the first multiplexer 52 is arranged in the data signal path to perform a dummy delay operation on the strobe signal DQS in order to compensate the time delay of the first multiplexer 52.

Figure 5B:
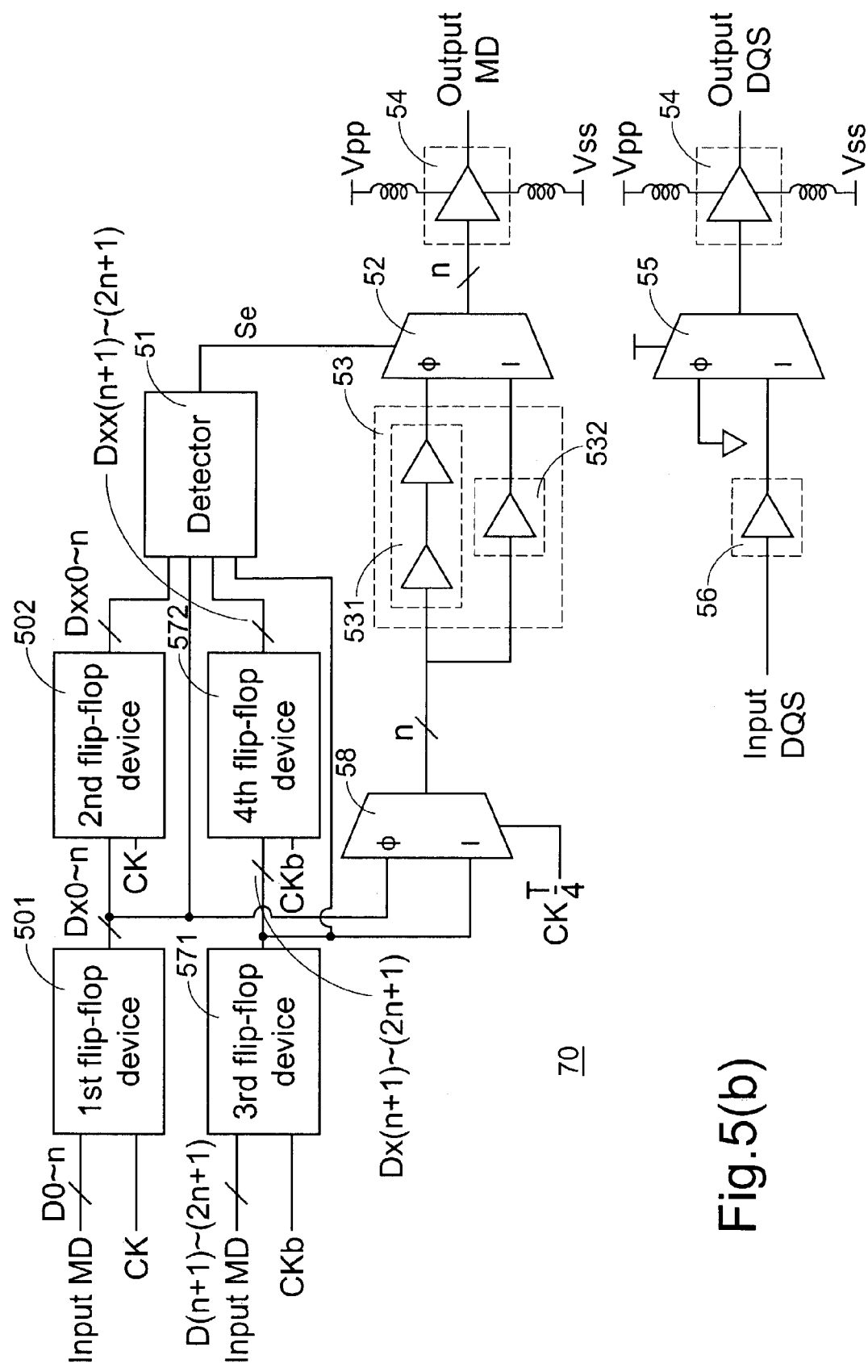

Please refer to FIG. 5(b), which schematically shows a sixth embodiment of the output circuit according to the present invention. The output circuit 70 of FIG. 5(b) is similar to that of FIG. 5(a) except that a third flip-flop device 571, a fourth flip-flop device 572 and a third multiplexer 58 are further included in the output circuit 70 in order to perform Double Data Rate (DDR) transmission. The output circuit 70 in this embodiment also outputs aligned parallel data signal and strobe signal by differentially adjusting the phase of the parallel data signal. The third flip-flop device 571 receives the input parallel data signal MD and a clock signal CKb. The clock signal CKb has a phase reverse to the clock signal CK. In response to either the rising or the falling edges of the clock signal CKb, the third flip-flop device 571 latches the input parallel data signal MD and then outputs third latched parallel data. The fourth flip-flop device 572 receives and latches the third latched parallel data in response to the rising or falling edge of the clock signal CKb, and then outputs fourth latched parallel data. Therefore, at a certain time point when the rising or falling edge of the clock signal CK is entered, parallel data D0~n are inputted to the first flip-flop device 501, first latched parallel data Dx0~n are outputted by the first flip-flop device 501, and second latched parallel data Dxx0~n are outputted by the second flip-flop device 502. The first latched parallel data Dx0~n are further outputted to the multiplexer 58. Subsequently, at next time point when the rising or falling edge of the clock signal CKb is entered, parallel data D(n+1)~(2n+1) are inputted to the third flip-flop device 571, third latched parallel data Dx(n+1)~(2n+1) are outputted by the third flip-flop device 571, and fourth latched parallel data Dxx(n+1)~(2n+1) are outputted by the fourth flip-flop device 572. The third latched parallel data Dx(n+1)~(2n+1) are also outputted to the multiplexer 58. In this embodiment, the first latched parallel data Dx0~n outputted from the first flip-flop device 501 and the third latched parallel data Dx(n+1)~(2n+1) outputted from the third flip-flop device 571 are alternately outputted by the multiplexer 58 in response to both of the rising and falling edges of a clock signal CKT/4, thereby achieving the purpose of DDR transmission. The clock signal CKT/4 is derived from the clock signal CK with ¼ cycle (90°) delay.

The detector 51 detects the latched parallel data, and outputs a select signal Se according to a level change degree of the parallel data realized by latching the parallel data signal MD at different time points. For example, the detector 51 detects the latched parallel data Dx0~n and Dxx0~n in response to the rising edge of the clock signal CK at the time point TP1, and detects the latched parallel data Dx(n+1)~(2n+1) and Dxx(n+1)~(2n+1) in response to the rising edge of the clock signal CKb at the time point TP2 next to TP1. In response to any of the detection operations, the detector 51 outputs the select signal Se indicative of a light switching group to have the multiplxer 52 select the output of the first delay circuit 531 or the select signal Se indicative of a heavy switching group to have the multiplxer 52 select the output of the first delay circuit 532. As has been understood from the first embodiment, while the parallel data signal MD outputted from the delay circuit 532 is delayed by a relatively short delay time Tl, the parallel data signal MD outputted from the delay circuit 531 is delayed by a relatively long delay time Th. The adjusting method illustrated with reference to the waveform diagram of FIG. 6 can also be applied here.

According to the output circuits and aligning methods illustrated above, it is understood that the parallel data signal and the strobe signal can be outputted with proper alignment by differentially adjusting the phase of the parallel data signal or strobe signal. Suitable delay circuits designed according to the present invention are provided to achieve this purpose. Due to the alignment of the parallel data signal and strobe signal, the SSO skew can be compensated so as to improve the data transmission quality.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An output circuit for outputting a strobe signal aligned with a parallel data signal, comprising:
   a level-change detecting device, comprising:
      a first flip-flop device receiving said parallel data signal and a first clock signal, and outputting a first latched parallel data in response to said first clock signal;
      a second flip-flop device connected to said first flip-flop device, receiving said first latched parallel data and said first clock signal, and then outputting a second latched parallel data in response to said first clock signal; and
      a detector connected to said first flip-flop device and said second flip-flop device, determining a first level change degree of said first latched parallel data and said second latched parallel data, and outputting a select signal according to said first level change degree;
   a delay adjusting device receiving a strobe signal and differentially delaying said strobe signal into a first and a second delayed strobe signals with a first and a second delay time, respectively; and
   a first multiplexer electrically connected to said level-change detecting device and said delay adjusting device, and selecting one of said first and said second delayed strobe signals to be outputted in response to said select signal.

2. The output circuit according to claim 1 wherein said delay adjusting device comprises:
   a first delay circuit electrically connected to said first multiplexer for delaying said strobe signal into said first delayed strobe signal and outputting said first delayed strobe signal with said first delay time; and
   a second delay circuit electrically connected to said first multiplexer for delaying said strobe signal into said second delayed strobe signal and outputting said second delayed strobe signal with said second delay time.

3. The output circuit according to claim 2 wherein each of said first delay circuit and said second delay circuit is controlled by a load control signal associated with a driven load required for data transmission.

4. The output circuit according to claim 3 wherein said driven load is detected by the basic input/output system (BIOS) when the computer is initialized.

5. The output circuit according to claim 1 wherein said level-change detecting device further comprises:
   a third flip-flop device connected to the detector, receiving said parallel data signal and a second clock signal, and then outputting a third latched parallel data in response to said second clock signal; and
   a fourth flip-flop device connected to the detector, receiving said third latched parallel data outputted from said third flip-flop device and said second clock signal, and then outputting a fourth latched parallel data in response to said second clock signal,
   wherein said detector determines a second level change degree of said third latched parallel data and said fourth latched parallel data, and outputting said select signal according to said second level change degree.

6. The output circuit according to claim 5 wherein said second clock signal is phase reversed to said first clock signal.

7. The output circuit according to claim 5 wherein said first flip-flop device and said second flip-flop device respectively latch said parallel data signal and said first latched parallel data at the rising edge of said first clock signal; wherein said third flip-flop device and said fourth flip-flop device respectively latch said parallel data signal and said third latched parallel data at the falling edge of said second clock signal.

8. The output circuit according to claim 5 wherein said first flip-flop device and said second flip-flop device respectively latch said parallel data signal and said first latched parallel data at the falling edge of said first clock signal; wherein said third flip-flop device and said fourth flip-flop device respectively latch said parallel data signal and said third latched parallel data at the rising edge of said second clock signal.

9. A method for outputting a strobe signal with a parallel data signal, comprising:
   latching said parallel data signal as a first latched parallel data in response to a first clock signal;
   latching said first latched parallel data as a second latched parallel data in response to said first clock signal;
   detecting a first level change degree of said first latched parallel data and said second latched parallel data, and outputting a selecting signal according to the first level change degree;
   delaying differentially an initial strobe signal into a plurality of delayed strobe signals with a plurality of delay time, respectively; and
   outputting one of the delayed strobe signals as said strobe signal in response to the selecting signal.

10. The method of claim 9 wherein the delayed strobe signals are differentially delayed according to a load control signal associated with a driven load required for data transmission.

11. The method of claim 10 wherein the driven load is detected by the basic input/output system.

12. The output circuit according to claim 1 wherein said first flip-flop device and said second flip-flop device respectively latch said parallel data signal and said first latched parallel data at either the rising edge or the falling edge of said first clock signal.

13. The method of claim 9 wherein said parallel data signal and said first latched parallel data are respectively latched at either the rising edge or the falling edge of said first clock signal.

14. The method of claim 9 wherein the method further comprising:
   latching said parallel data signal as a third latched parallel data in response to a second clock signal;
   latching said third latched parallel data as a fourth latched parallel data in response to said second clock signal;
   detecting a second level change degree of said third latched parallel data and said fourth latched parallel data, and outputting a selecting signal according to the second level change degree.

15. The method of claim 14 wherein said second clock signal is phase reversed to said first clock signal.

16. The method of claim 14 wherein said parallel data signal and said first latched parallel data are respectively latched at the rising edge of said first clock signal; wherein said parallel data signal and said third latched parallel data are respectively latched at the falling edge of said second clock signal.

17. The method of claim 14 wherein said parallel data signal and said first latched parallel data are respectively latched at the falling edge of said first clock signal; wherein said parallel data signal and said third latched parallel data are respectively latched at the rising edge of said second clock signal.

* * * * *